(12) United States Patent
Subasic et al.

(10) Patent No.: US 7,603,642 B2
(45) Date of Patent: Oct. 13, 2009

(54) PLACER WITH WIRES FOR RF AND ANALOG DESIGN

(75) Inventors: Pero Subasic, Santa Clara, CA (US); Xuejin Wang, Chandler, AZ (US); Enis A. Dengi, Tempe, AZ (US); Ibraz H. Mohammed, Tempe, AZ (US)

(73) Assignee: Cadence Design Systems, Inc., San Jose, CA (US)

( * ) Notice: Subject to any disclaimer, the term of this patent is extended or adjusted under 35 U.S.C. 154(b) by 477 days.

(21) Appl. No.: 11/528,235

(22) Filed: Sep. 27, 2006

(65) Prior Publication Data

US 2008/0077898 A1   Mar. 27, 2008

(51) Int. Cl.
    *G06F 17/50* (2006.01)
(52) U.S. Cl. .............................. 716/10; 716/12; 716/14
(58) Field of Classification Search ............... 716/10, 716/12, 14
    See application file for complete search history.

(56) References Cited

U.S. PATENT DOCUMENTS 6,155,725 A * 12/2000 Scepanovic et al. ............ 716/9
6,505,329 B1 * 1/2003 Matsuzawa ..................... 716/8

OTHER PUBLICATIONS

"Leading Prolog Technology"; http://www.sics.se/isl/sicstuswww/site/index.html (1 p.).
Intelligent Systems Laboratory; "SICStus Prolog User's Manual"; Swedish Institute of Computer Science; Kista, Sweden, Rel. 3.11.2, Jun. 2004; Chapter 34; (51 pp.).

* cited by examiner

*Primary Examiner*—Jack Chiang
*Assistant Examiner*—Brandon W Bowers
(74) *Attorney, Agent, or Firm*—The Webb Law Firm

(57) ABSTRACT

The invention is a method of placement of components and networks (nets), utilized for interconnecting the components, of a circuit layout. The method includes forming for electrical devices, pads (or lands) and networks (nets) of a circuit layout a listing of the positions thereof with respect to one another, connections therebetween and the orientation of each net or subnet thereof in the circuit layout. The thus formed list is processed subject to at least one objective regarding the size of the circuit layout, whereupon a placement of the electrical devices and the pads is determined simultaneously with the placement of the networks.

22 Claims, 7 Drawing Sheets

PLACER WITH WIRES FOR RF AND ANALOG DESIGN

GOVERNMENT INTERESTS

The United States has a paid up license in this invention and the right in limited circumstances to require the patent owner to license others on reasonable terms as provided for by the terms of TIA F33615-01-2-1970 awarded by USAF/AFMC, Air Force Research Laboratory, Wright-Patterson AFB OH 45433-7801.

BACKGROUND OF THE INVENTION

1. Field of the Invention

The present invention relates to the design of integrated circuits and, more particularly, to the layout of the objects, i.e., devices, pads, and networks, of the integrated circuit.

2. Description of Related Art

Heretofore, physical synthesis of an Integrated Circuit (IC) involved two distinct successive phases of placement and routing, each of which is typically performed by separate, specialized software packages, called a placer and a router, designed to perform the corresponding function. The placer arranges the circuit components (devices and pads) on a layout surface while the router defines paths connecting placed components on the layout surface, on which conductors that carry electrical signals are run. Since the placer typically takes limited routing information into consideration during its operation, it exercises restricted control on routing topology.

The performance of Radio Frequency Integrated Circuits (RFICs) is highly sensitive to interconnect parasitic effects, which are artifacts of the physical layout of the circuit. Interconnect parasitics are a function of the routing topology, and can vary with differing topologies.

A typical circuit synthesis design flow for RFICs, based on automatic sizing with layout parasitics, explores the design space, iteratively examining different sizes of various devices until a combination thereof is found that meets or exceeds the circuit specifications. Corresponding to each set of device sizes that is visited by the circuit synthesis tool, a placed and routed layout is realized from which interconnect parasitics are estimated in turn.

In the prior art, as the device sizes change during the circuit synthesis process, the placements obtained therefrom often make the router create different routing topologies, due to insufficient routing information modeled during the placement phase. This has the effect of making the layout parasitics change significantly from one layout to another, which in turn interferes with the synthesis tool's search for the optimal device sizes for a design.

Additionally, in the prior art, due to the lack of tangible representation of the structure of an interconnect during placement and routing, it was inconvenient to specify keep-out areas for interconnects, to prevent coupling effects among sensitive interconnects and components in the design.

It would, therefore, be desirable to overcome the above problems by providing a method whereupon interconnects are treated as regular placeable objects; and the placement of devices, pads and interconnects of an integrated circuit is accomplished simultaneously. By performing simultaneous placement and routing, the routing topology of critical interconnects, intended by the designer, is captured as an integral input (example-based routing) and enforced as an essential constraint within the placement process. Therefore, this eliminates the unpredictability of varying routing patterns obtained by running the router on a placed layout as a subsequent step during the circuit synthesis process. Further, the simple representation of an interconnect in terms of individual connected segments permits convenient specification of keep-out areas around sensitive interconnects allowing coupling-aware placement. In addition, the simple interconnect representation in the placer encourages the use of accurate simulation models in the synthesis flow, increasing the accuracy of the results. Additional features and advantages of the present invention will become apparent to those of ordinary skill in the art upon reading and understanding the following detailed description.

SUMMARY OF THE INVENTION

The invention is a method of placement of components and networks (nets), utilized for interconnecting said components, of a circuit layout. The method includes (a) providing a solver operative for implementing optimizing software; (b) inputting into the solver for each device of the circuit layout data regarding: (1) the dimensions of said device, (2) each terminal of said device, and (3) the connection of each terminal to at least one net of the circuit layout; (c) inputting into the solver for each pad (or land) of the circuit layout data regarding: (1) the dimensions of said pad, and (2) the connection of said pad to at least one net; (d) inputting into the solver for each junction (or anchor) of a net of the circuit layout data regarding the dimensions of said junction; (e) inputting into the solver for each net or segment thereof data regarding: (1) at least one dimension of said net or segment, (2) an orientation of said net or segment in the circuit layout, (3) the connection of each terminal of said net or segment to a device, pad, or junction, and (4) the relative locations of the terminals of said net or segment with respect to each other; (f) inputting into the solver at least one intermediary that defines an imaginary line in the circuit layout that is used as a reference for determining the position of at least one object of the circuit layout, wherein each object is either a device, a pad, a junction, or a net or segment thereof; (g) inputting into the solver at least one symmetry constraint that defines positional symmetry between at least two objects of the circuit layout about an intermediary input in step (f); (h) inputting into the solver at least one alignment constraint that defines an alignment between at least two objects of the circuit; (i) inputting into the solver a plurality of topological constraints, each of which defines the relative position of at least two objects of the circuit layout; (j) inputting into the solver at least one objective for the solver to attempt to satisfy based on the constraints inputs to the solver, wherein the objective includes minimizing at least one of the area of the circuit layout and a total length of the nets of the circuit layout; and (k) causing the solver to process the input constraints subject to the input objective(s) to simultaneously determine placements of the objects and the nets that is either (1) satisfactory, given a processing constraint imposed on the solver that is not related per se to said placements, (2) legal and feasible, or (3) optimal.

The solver can be a constraint logic programming over finite domains (CLPFD) solver, such as, for example, without limitation, the SICStus Prolog solver.

Each symmetry constraint can be either: a simple symmetry constraint wherein two identical objects having the same orientation are placed on either side of the intermediary; a mirror symmetry constraint wherein two identical objects having mirror-image orientation are placed on either side of the intermediary; or a self symmetry constraint wherein one object is placed symmetrically on the intermediary.

Each alignment constraint can specify alignment of the at least two objects thereof along edges, sides or centers thereof. The edges, sides or centers of the two objects can also be aligned to an intermediary input in step (f).

The method can further include inputting into the solver at least one of the following constraints prior to executing step (k): an orientation constraint that defines a common orientation for at least two identical objects; a fixed location constraint that defines an exact location of an object in the circuit layout; and a pair-wise separation constraint that defines a minimum distance that at least two objects should be placed from one another.

At least one of step (b), (c) or (d) can further include inputting into the solver for at least one object thereof halo dimensions which define a minimum distance said object can be spaced from another object.

In step (e), the orientation can be either vertical or horizontal, each net or segment thereof can include a terminal on each end thereof, and/or the relative location of one terminal of a net or segment can be either to the top, bottom, right or left of another terminal of the net or segment.

The invention is also a method of placement of devices, pads and networks (nets), utilized for interconnecting said devices and pads, of a circuit layout. The method includes (a) defining for each device of the circuit layout a device constraint that comprises dimensions and terminal(s) of said device and the connection of each terminal of said device to a net of the circuit layout; (b) defining for each pad (or land) of the circuit layout a pad constraint that comprises dimensions of said pad and the connection of said pad to a net of the circuit layout; (c) defining for each junction (or anchor) of a net of the circuit layout a junction constraint that comprises dimensions of said junction and the association of said junction with said net; (d) defining for each net or segment thereof of the circuit layout a net constraint that comprises at least one dimension and terminals of said net or segment thereof and the connection of each terminal of said net or segment thereof to a device, pad, or junction of the circuit layout; (e) defining an objective for minimizing at least one of the area of the circuit layout in which the devices, pads, junctions and nets reside and/or a total length of the nets of the circuit layout; and (f) utilizing an optimization program to process each defined constraint subject to the objective defined in step (e) to simultaneously determine placements of the devices, pads and nets.

The optimization program can determine placements of the devices, pads and nets that is either (1) satisfactory given a processing constraint imposed on the optimization program that is not per se related to said placements, (2) legal and feasible, or (3) optimal.

The method can further include, prior to step (f), the steps of: defining for each intermediary (or imaginary line) defined in the circuit layout that is used as a reference for determining the position of at least one object of the circuit layout an intermediary constraint that comprises an orientation of the intermediary and its location in the circuit layout, wherein each object is either a device, a pad, a junction, or a net or segment thereof; and defining at least one of the following: a symmetry constraint that defines positional symmetry between at least two objects of the circuit layout about an intermediary; an alignment constraint that defines an alignment between at least two objects of the circuit; and/or a topological constraint that defines the relative position of at least two objects of the circuit layout.

The optimization program can be a constraint logic programming over finite domains (CLPFD) optimization program, such as, without limitation the SICStus Prolog optimization program available from Swedish Institute of Computer Science, P.O. Box 1263, SSE-164 29 Kista, Sweden.

The invention is also a method of placement of devices and networks (nets), utilized for interconnecting said devices, of a circuit layout that includes (a) defining constraints related to the positions of objects of a circuit layout with respect to one another, wherein each object is either a net or segment thereof, an electronic device, a pad, or a junction of a net of the circuit layout; (b) defining for each net or segment thereof of the circuit layout a net constraint that comprises an orientation of said net or segment thereof in the circuit layout, the terminals of said net or segment thereof, and the connection of each terminal of said net or segment thereof to another object of the circuit layout; and (c) electronically minimizing at least one of the following subject to the defined constraints thereby determining a layout of the objects and the nets: an area in which the objects of the circuit layout reside; an area in which the nets of the circuit layout reside; and/or the total length of the nets of the circuit layout.

The constraints of step (a) can include at least one of the following: a symmetry constraint that comprises positional symmetry between at least two objects of the circuit layout; an alignment constraint that defines an alignment between at least two objects of the circuit; and/or a topological constraint that defines the relative position of at least two objects of the circuit layout.

The method can further include defining at least one imaginary line in the circuit layout that is utilized by either at least one of the symmetry or alignment constraints for placement of the two objects thereof.

The method can further include defining at least one of the following constraints: a device constraint that comprises dimensions and terminal(s) of an electronic device of the circuit layout and the connection of each terminal of said electronic device to a net of the circuit layout; a pad constraint that comprises dimensions of the pad (or land) of the circuit layout and the connection of said pad to a net of the circuit layout; and/or a junction constraint that comprises dimensions of a junction (or anchor) of a net of the circuit layout and the association of said junction with said net.

The invention is also a method of placement of components and networks (nets), utilized for interconnecting said components, of a circuit layout, that includes (a) defining the position of each component, pad (or land), and/or junction (or anchor) of a net of a circuit layout with respect to at least one other component, pad or junction; (b) defining connections of nets or segments thereof to said components, pad and/or junctions; (c) defining the horizontal or vertical orientation of each net or segment thereof in the circuit layout; and (d) simultaneously determining a placement of the components, pads and/or junctions and the nets as a function of the definitions in steps (a)-(c) subject to at least one of the following: (1) an area of the circuit layout in which the components, pads and/or junctions and the nets reside, and (2) a total length of the nets of the circuit layout.

The invention is also a method of placement of components and networks (nets), utilized for interconnecting said components, of a circuit layout. The method includes forming for electrical devices, pads (or lands) and networks (nets) of a circuit layout a listing of the positions thereof with respect to one another, connections therebetween and the orientation of each net or segment thereof in the circuit layout; and processing the listing subject to at least one objective thereby simultaneously determining a placement of the electrical devices, the pads and the networks.

Lastly, the invention is a method of placement of objects of a circuit layout. The method includes (a) defining constraints for objects of a circuit layout, wherein each constraint comprises at least one dimension of the corresponding object, each object is either a circuit device, a pad, a net or segment thereof, or a junction of nets and/or segments thereof, and said constraints also define the connectivity of the net(s) or segment(s) thereof to the other objects of the circuit layout; and (b) utilizing an optimization program to process the defined constraints to simultaneously determine the placement of all of the objects of the circuit layout.

The method can also include defining at least one objective for the placement of the objects, wherein step (b) includes utilizing an optimization program to process the defined constraints subject to the defined objective(s) to simultaneously determine placements of all of the objects.

BRIEF DESCRIPTION OF THE DRAWINGS

FIG. 2c is a layout view of the circuit shown in FIG. 2a;

DETAILED DESCRIPTION OF THE INVENTION

The present invention is a computer implemented method of simultaneously placing the devices or components of a circuit, such as an electronic circuit, and the networks (nets) of wires of RF and analog designs. The present invention reduces the time required to perform a final layout of the devices and nets of the circuit to be implemented in integrated circuit (IC) form on a semiconductor substrate over prior art methods where the layout of devices or components and the routing of networks occur as iterative, unrelated processes. The present invention will now be described with reference to the accompanying figures where like reference numbers correspond to like elements.

Figure 1:
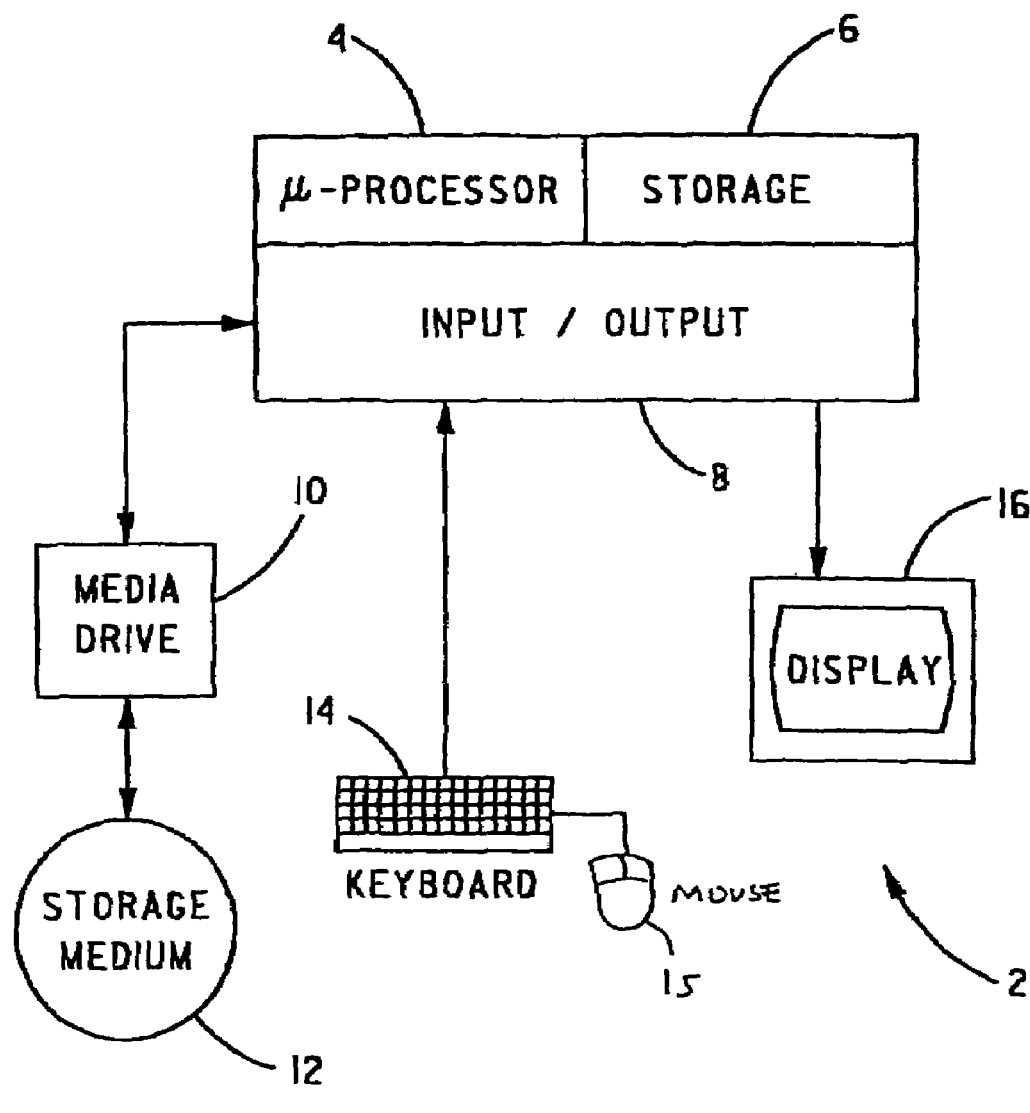
FIG. 1 is a block diagram of an exemplary computer system which is capable of executing the computer software that embodies the computer implemented method of the present invention.

With reference to FIG. 1, the computer implemented method of the present invention is embodied in computer software which operates on a computer system 2 in a manner known in the art. Computer system 2 includes a microprocessor 4, a storage or memory 6 and an input/output system 8. Computer system 2 can also include a media drive 10, such as a disk drive, CD ROM drive, and the like. Media drive 10 may operate with a computer usable storage medium 12 capable of storing the computer readable program code comprising the computer software which embodies the present invention, which computer readable program code is able to configure and operate computer system 2 in a manner to implement the present invention. Input/output system 8 may operate with a keyboard 14, a mouse 15 and/or a display 16. Output means other than display 16, such as a printer (not shown), may also be provided. Computer system 2 is exemplary of computer systems capable of executing the computer software which embodies the present invention and is not to be construed in any manner as limiting the invention.

The software or data inputs to the computer software of the present invention comprise the following: specification of components; specification of interconnects; specification of placement constraints; specification of design rules; and specification of objective function or cost strategy along with search parameters utilized by the computer software of the present invention.

The computer software of the present invention takes the foregoing inputs and implements a so-called "solver" or optimization program that processes the foregoing inputs and outputs a placed and routed layout solution that desirably satisfies all placement constraints; meets all design rules; and achieves a best possible objective function, e.g., minimized layout width, height, area, wire length, or some combination thereof. In one particularly preferred embodiment, the optimization program or solver is a so-called constraint logic programming over finite domains (CLPFD) solver, in particular the SICStus Prolog solver available from the Swedish Institute of Computer Science, P.O. Box 1263, SSE-164 29 Kista, Sweden. However, this is not to be construed as limiting the invention since it is envisioned that any suitable and/or desirable optimization program or solver can be utilized. For purpose of describing the present invention, it will be assumed hereinafter that the optimizing program or solver is the SICStus Prolog CLPFD solver (hereinafter "the CLPFD solver"). However, this is not to be construed as limiting the invention.

Specification of Components:

The following data is input into the CLPFD solver for each device or component of the circuit: horizontal dimension (width); vertical dimension (height); each device terminal and its location; one or more so-called device halos; and a list of allowed orientations.

Device terminal information includes the physical layout of each terminal on the device itself and the external net that connects to this terminal. The physical layout of the terminal can be specified either in a global coordinate system of a top level layout or a local coordinate system of the device, in which case appropriate transformation to the top level coordinate system is needed for calculation of net length.

Device halos are sensitive, keep-out areas around the device, where there should be no geometry of another device or component, and are typically specified on all four sides of the device.

The possible orientations for a component include R0 (no rotation), R0MX (mirror with respect to the x-axis), R0MY (mirror with respect to the y-axis), R0MXMY (mirror with respect to the x and y axes), R90 (counterclockwise (or clockwise) rotation by 90°), R90MX (counterclockwise (or clockwise) rotation by 90°, followed by mirror with respect to the x-axis), R90MY (counterclockwise (or clockwise) rotation by 90° followed by mirror with respect to the y-axis), and R90MXMY (counterclockwise (or clockwise) rotation by 90° followed by mirror with respect to the x and y axes).

A well-known category of devices or components known as pads or lands are typically placed along the periphery of the circuit. These pads or lands are utilized to interconnect the circuit with external devices, such as, without limitation, another electronic circuit, a lead frame of packaging for the electronic circuit, a printed circuit board, etc.

Figure 2A:
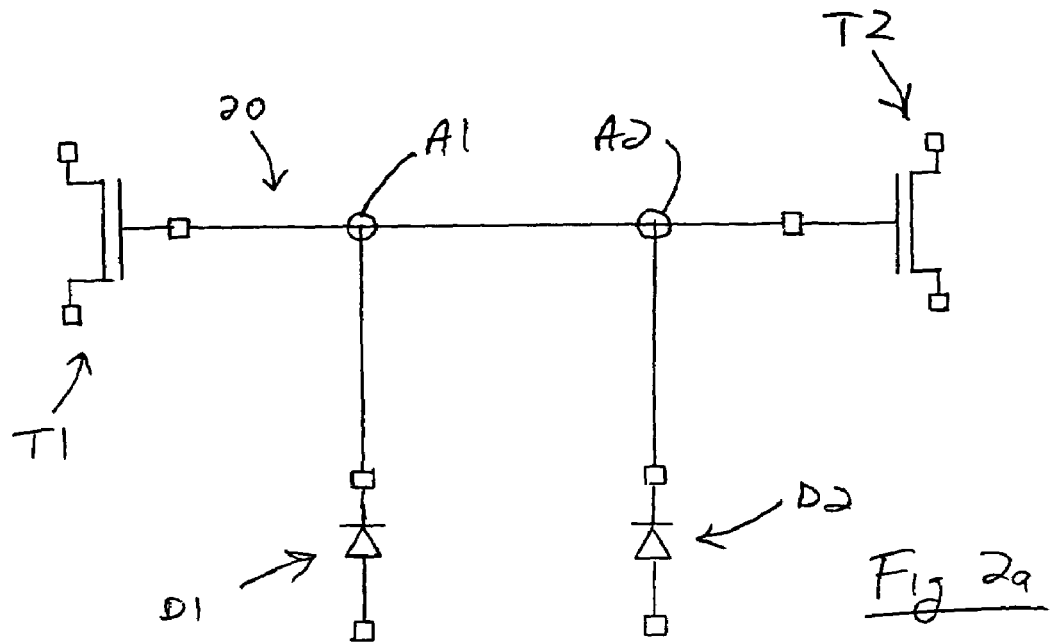
FIGS. 2a and 2b are a schematic view and block diagram view, respectively, of an exemplary circuit.
Figure 2B:
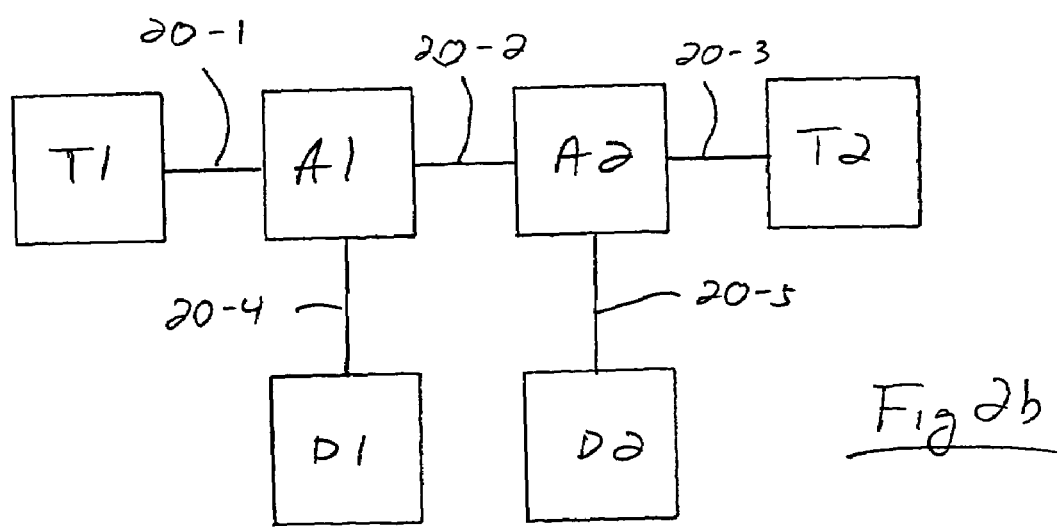

Specification of Interconnects:

To facilitate formation of the intended topology of the network, so-called branch points or anchors can be defined as required on one or more nets utilizing a graphical user interface in a schematic view of the circuit, see, e.g., FIG. 2a. Each anchor or branch point effectively breaks the corresponding net into multiple subnets, each of which essentially carries the same electrical signal. Consider, for example, the schematic view of the circuit shown in FIG. 2a, wherein a network 20 connects transistors T1 and T2 and diodes D1 and D2 as shown. Assume that the specified topology of net 20 needs to be captured on a layout view. In order to accomplish this capture, anchors or branch points A1 and A2 are defined on net 20 by the designer as shown in FIG. 2a. As can be seen in the block diagram view of the circuit shown in FIG. 2b, each anchor point A1 and A2 is a three-terminal anchor that enables net 20 to be segmented into five subnets 20-1, 20-2, 20-3, 20-4 and 20-5.

These subnets are realized on an IC chip by traces of conducting material or so-called routes. Desirably, each trace of conducting material is an N-sided polygon shape, desirably rectangular shaped. Therefore, a physical connection between devices or components and anchors in a layout view is realized by a set of rectangle shaped objects on various layers of the IC chip. An exemplary layout view of the electronic circuit shown in FIG. 2a is shown in FIG. 2c.

Figure 2C:
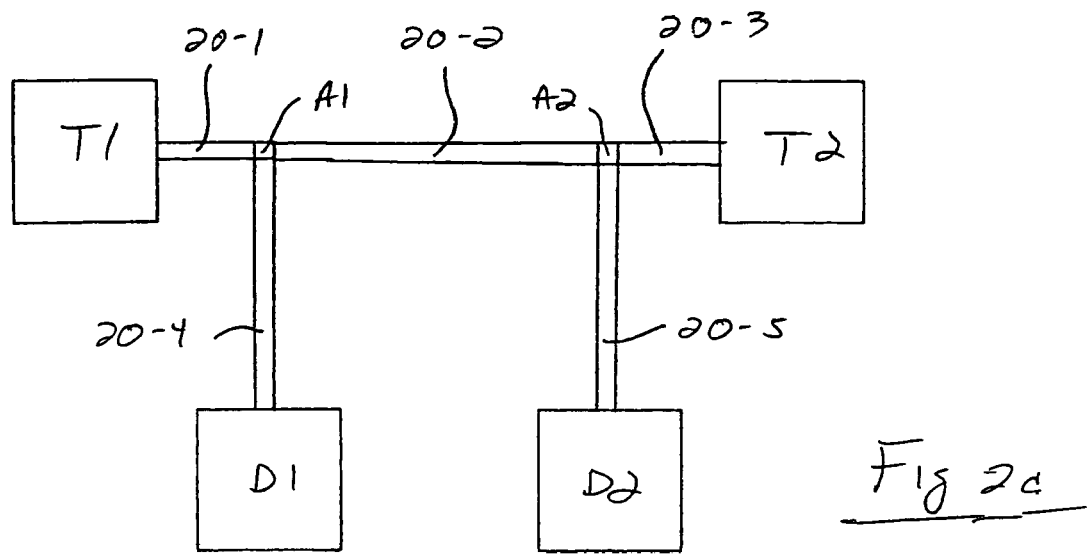

As can be seen in FIG. 2c, depending on the relative placement of the devices or components in the layout, a physical connection can include several horizontal and vertical interconnected subnets. Anchors A1 and A2 are inserted at each bend to facilitate formulation of placement constraints (described hereinafter) between subnets that share a corner. For example, in FIG. 2c, the physical connection between transistor T1 and diode D1 is realized via horizontal subnet 20-1, vertical subnet 20-4 and anchor A1. Similarly, transistor T2 is connected to diode D1 via vertical subnet 20-4, horizontal subnets 20-2 and 20-3 and anchors A1 and A2.

Anchors enable the enforcement of a desired net topology. In addition, anchors also facilitate relating horizontal and vertical subnets at jogs or bends, thereby facilitating specification of the physical net structure and formulation of placement constraints (discussed hereinafter).

The following data is utilized to describe a net or subnet in the CLPFD solver: electrical signal that the net or subnet carries; list of components that are connected by the net or subnet; list of anchors or branch points created on this net; list of horizontal and vertical segments or subnets of this net; and whether the net is critical or non-critical.

A horizontal subnet is described by the left and right objects it connects, the width of the conductor trace forming the horizontal subnet, and the layer or layers of the IC chip where the conductor trace defining the subnet is to reside. Likewise, a vertical subnet is defined by the top and bottom objects it connects, the width of the conductor trace forming the vertical subnet, and the layer or layers of the IC chip where the conductor trace defining the vertical subnet is to reside. It is to be appreciated that various subnets of a net can have different widths and/or be on different layers of the IC chip since the net may be routed to various devices with different widths and/or on different layers. Desirably, the width and layer of a subnet are design parameters that are either specified manually by the circuit designer or explored by a circuit synthesis tool. For purpose of describing the invention, both the width and layer of each subnet will be described as inputs to the present invention. However, this is not to be construed as limiting the invention.

Desirably, each subnet is constrained by the width of the conductor trace defining the subnet in one dimension, but is flexible in the other dimension. For example, a horizontal subnet can be made longer or shorter in the horizontal direction by the CLPFD solver, whereas a vertical subnet can be made longer or shorter in the vertical direction by the CLPFD solver. The length of a subnet can be constrained to have a minimum and/or maximum length. When the CLPFD solver operates on objects, such as devices, anchors, pads or lands, nets or subnets, etc., to create a layout, the flexible dimensions of the subnets can be changed in addition to the locations of said objects.

Desirably, anchors are top level metal rectangles on a given layer of an IC chip. The physical dimensions of an anchor is desirably based on the widths of the incident subnets. For example, if an anchor is formed by the intersection of a horizontal and vertical subnets having widths of 10 and 15 units, the anchor will have vertical and horizontal dimensions of 10 and 15 units corresponding to the vertical and horizontal dimensions of the horizontal and vertical subnets, respectively.

It has been observed that classifying certain nets as being critical or non-critical can be useful. For example, in an RF design, nets that convey signals are usually considered as critical nets because the parasitics associated with such nets can have a significant impact on the circuit performance. In contrast, nets that connect DC components can be classified as non-critical. Different weights can be associated with critical and non-critical nets while computing their total interconnect length, which, desirably, is part of the overall cost function.

As is well-known, physical connection between subnets that exist on different layers of an IC is achieved through so-called vias that extend from one conductive layer to another, or through-contacts that go between a first conductive layer to the silicon substrate, at a transition point.

Specification of Placement Constraints:

In order for the CLPFD solver to determine an optimal placement of objects, such as devices, anchors, pads, nets or subnets of an IC, it is necessary to input into the CLPFD solver a set of properly formatted placement constraints. Details regarding one instantiation of placement constraints that can be input into the CLPFD solver will be described hereinafter in connection with FIGS. 7 and 8.

The placement constraints supported by the CLPFD solver can be broadly classified as follows: topological or spatial constraints (includes relative location, objects and external boundary abutment constraints); symmetry constraints; alignment constraints; match orientation constraints; fixed location constraints; pair-wise separation constraints; approximate location constraints; and group constraints. Some or all of the foregoing constraints can be input into the CLPFD solver manually or can be input in an automated or semi-automated process, wherein an example layout is initially created using nominal object sizes whereafter an automatic constraint extraction tool can scan the example layout and derive the constraints implicit in the layout by examining the positions of said objects.

The CLPFD solver makes use of one or more so-called "intermediaries". Each intermediary is an abstract object (meaning it is not a real device, anchor, pad, net or subnet that is actually placed on the silicon) that is defined to enable relationships among other objects, or between objects and a so-called "cell" or "container" in which the objects reside, to be defined. Desirably, each intermediary is either a horizontal or vertical line object. Several constraints, such as symmetry constraints, alignment constraints, fixed placement constraints, etc. (described hereinafter), will utilize an intermediary to relate the objects participating in the constraint.

It has been observed that it is useful to define certain default intermediaries that relate to some feature of the overall layout, such as a boundary of a cell (discussed hereinafter) and/or center lines of horizontal and/or vertical bisections of a cell. One intermediary can also be related to another, thereby creating complex relationships and placement behavior.

An exemplary, non-limiting format of an intermediary that can be input into the CLPFD solver includes: intermediary (intermediary_ID, container_ID, X, Y, left\right, top\bottom, relative\absolute), wherein the parameter intermediary_ID is defined with respect to some feature of the container parameter (group or overall layout) container_ID. The relative parameter signifies that the parameters X and Y denote relative distances to container boundary edges specified by left\right and top\bottom, respectively. Relative distances are specified in percent width for X parameter, and percent height for Y parameter. Likewise, the absolute parameter signifies that the parameters X and Y denote absolute distances to container boundary edges specified by left\right and top\bottom, respectively. The present invention also supports the concept of floating horizontal (no fixed Y coordinate) and vertical (no fixed X coordinate) intermediaries, which are also specified using the above format with the relative parameter and the keywords top\bottom and left\right (for horizontal and vertical intermediaries, respectively) replaced with the keyword floating.

Topological/Spatial Constraints:

Topological/spatial constraints describe basic spatial relationships among objects of the circuit layout, wherein each object is either a device, a pad, a junction, a net or a subnet. The topological/spatial constraints entitled leftmost, rightmost, topmost, and bottommost specify abutment of an object with an external boundary. They define around-the-layout-edges positions of objects, and denote sharing of the left, right, top, and bottom boundaries of the object with the counterpart boundaries of the layout. For example, a leftmost object is an object whose left boundary edge aligns horizontally with the left boundary edge of the whole layout. Multiple objects can be defined as being leftmost, rightmost, topmost or bottommost.

The constraints entitled immediate_left, immediate_right, immediate_top, and immediate_bottom denote object abutment. They define tight relative location relationships between two objects in the layout and imply at least partial sharing of two boundaries of the objects participating in the relationship.

The constraints entitled left, right, top, and bottom define relaxed relative location relationships between two objects in the layout and do not define any immediate adjacency or boundary sharing between the objects participating in the relationship. The tight and relaxed relative location constraints represent the same relative positioning of objects in the layout. However, the relaxed constraint allows for unspecified empty spaces between objects, because the spatial relationships are not immediate.

All of the foregoing topology/spatial constraints can be further qualified to create a new constraint that considers so-called keep-out areas of the objects (so-called device and/or wire halos) involved in the relationship.

Exemplary, non-limiting formats of topology/spatial constraints that can be input into the CLPFD solver include:

1. leftmost(A): Object A shares its left boundary with the left boundary of the overall layout.
2. rightmost(B). Object B shares its right boundary with the right boundary of the overall layout.
3. topmost(C): Object C shares its top boundary with the top boundary of the overall layout.
4. bottommost(D): Object D shares its bottom boundary with the bottom boundary of the overall layout.
5. immediate_left(E, F): Object E is immediately to the left of object F; and there exists at least a partial sharing of the right and left boundaries of objects E and F, respectively.
6. immediate_right(G, H): Object G is immediately to the right of object H; and there exists at least a partial sharing of the left and right boundaries of objects G and H, respectively.
7. immediate_top(I, J): Object I is immediately to the top of object J; and there exists at least a partial sharing of the bottom and top boundaries of objects I and J, respectively.
8. immediate_bottom(K, L): Object K is immediately to the bottom of object L; and there exists at least a partial sharing of the top and bottom boundaries of objects K and L, respectively.
9. left(M N): Object M is anywhere to the left of object N.
10. right(O, P). Object O is anywhere to the right of object P.
11. top(Q, R): Object Q is anywhere to the top of object R.
12. bottom(S, T): Object S is anywhere to the bottom of object T.

Symmetry Constraints:

A symmetry constraint denotes positional symmetry between two identical objects in a circuit layout. Symmetry can be horizontal or vertical and is defined with respect to an axis of symmetry, e.g., without limitation, an intermediary.

Figure 3:
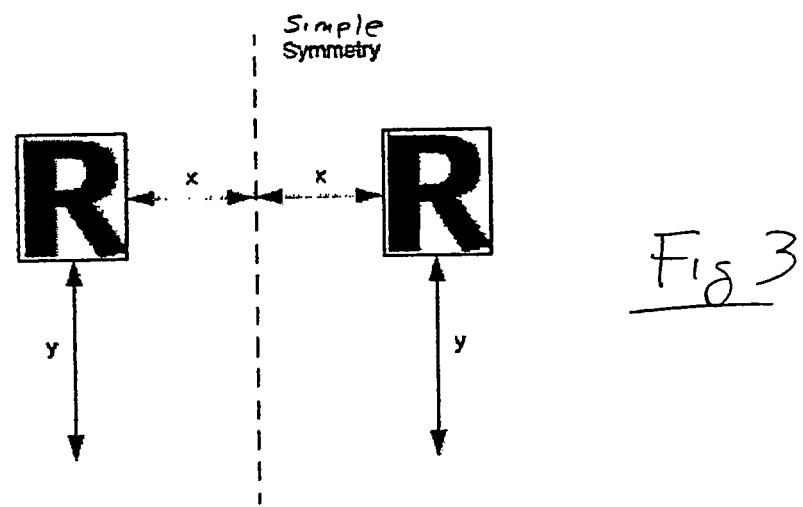
FIG. 3 is a block diagram of simple symmetry where two identical objects in the same orientation are located on either side of an intermediary.
Figure 4:
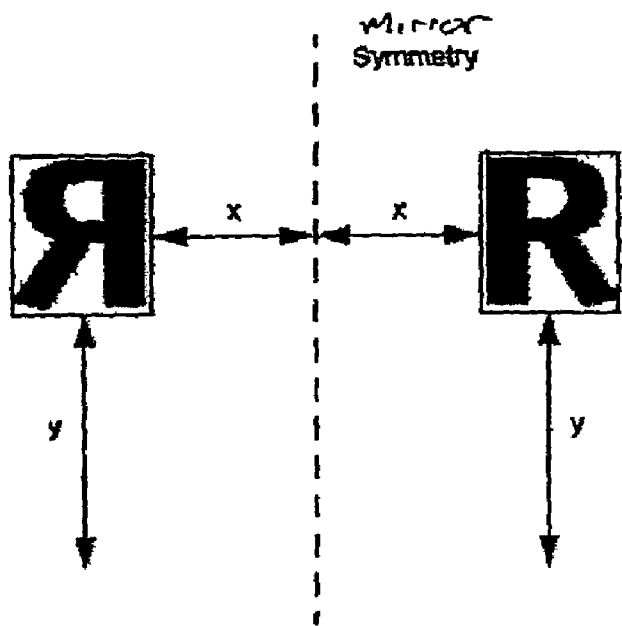
FIG. 4 is a block diagram of mirror symmetry where two identical objects are positioned as mirror images on opposite sides of an intermediary.
Figure 5:
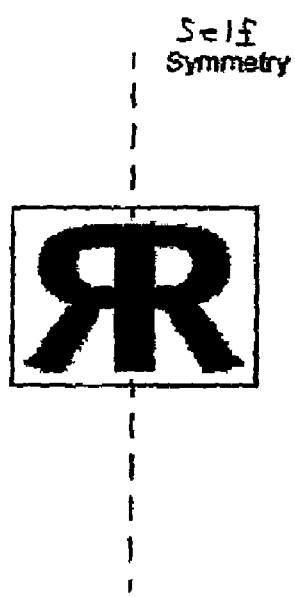
FIG. 5 is a block diagram of self symmetry where a single object is disposed symmetrically about an intermediary.

In practice, there are three types of symmetry: simple, mirror and self symmetry. Simple symmetry places two identical objects in the same orientation on either side of an axis of symmetry, as shown in FIG. 3. Mirror symmetry places two identical objects as mirror-images (left-right or top-bottom reversed) on either side of an axis of symmetry, as shown in FIG. 4. Self symmetry places an object symmetrically on the axis of symmetry itself, as shown in FIG. 5. The vertical center line of a vertically self-symmetric object is constrained to lie on the vertical axis of symmetry. It should be appreciated that two objects participate in simple and mirror symmetry relationship, whereas self symmetry relationship involves only a single object.

The purpose and use of each type of symmetry shown in FIGS. 3-5 is well-known to those skilled in the art and will not be described in greater detail herein for purpose of simplicity.

A mirror symmetry constraint is one, non-limiting example of a so-called compound constraint that is decomposed into basic (canonical) constraints to be used by the CLPFD solver. For example, a mirror symmetry constraint is the combination of a simple symmetry constraint and a match orientation constraint (described hereinafter) rotated by 180 degrees. Mirror symmetry is but one example of a compound constraint. It is envisioned that other types of compound constraints can also be formulated as necessary. For example, a compound alignment constraint can be formed from a plurality of individual alignment constraints (discussed hereinafter) or a compound symmetry constraint can be formed from two or more symmetry constraints. However, this is not to be construed as limiting the invention.

Symmetry on nets or subnets can be realized by enforcing symmetric constraints either directly on individual nets or subnets, or indirectly on the devices, pads or anchors, or on a combination of both.

Exemplary, non-limiting formats of symmetry constraints that can be input into the CLPFD solver will now be described with reference to an intermediary called vertical_symmetry_line, which bisects the layout vertically as the vertical axis of symmetry, for the following horizontal symmetry relationships between objects.

1. symmetry(A, B, vertical_symmetry_line): This constraint enforces horizontal symmetry between objects A and B with respect to vertical_symmetry_line. Objects A and B desirably have identical dimensions.
2. symmetry(C, vertical_symmetry_line): This constraint enforces horizontal self symmetry for object C with respect to vertical_symmetry_line. Object C desirably is left-right mirror-symmetric about its own vertical center line, to take maximum advantage of this form of symmetry.
3. symmetry(net_P_segment_P1, net_Q_segment_Q1, vertical_symmetry_line): This constraint ensures that subnets P1 and Q1 of nets P and Q, respectively, are placed symmetrically in the horizontal direction with respect to vertical_symmetry_line. The two route segments are desirably placed on the same layer, have the same routing width and extent of run (length).
4. symmetry(net_R_segment_R1, vertical_symmetry_line): This constraint ensures that subnet R1 of net R is placed self-symmetrically in the horizontal direction with respect to vertical_symmetry_line. The route segment will have half of its extent of run (length) on either side of the axis of symmetry.

Alignment Constraints:

Each alignment constraint is defined with respect to a feature of an object associated with the constraint. It is not necessary for two aligned objects to have the same physical dimensions. Horizontal alignment defines a constraint relating two objects that enforces the alignment of their top edges, bottom edges, or horizontal center lines (lines of horizontal bisection). Likewise, vertical alignment defines a constraint relating two objects that enforces the alignment of their left edges, right edges, or vertical center lines (lines of vertical bisection). In addition, the CLPFD solver supports alignment of an object with a specified horizontal or vertical intermediary. Therefore, it is possible to align the left edges, right edges, or vertical center lines of objects with a specified vertical intermediary, and similarly align the top edges, bottom edges, or horizontal center lines of objects with a specified horizontal intermediary. Desirably, an intermediary can also be aligned with some feature (boundary or center edges) of another object or a container object that includes a group of objects, causing a given object to be placed at a specified offset from a specified target.

Figure 6:
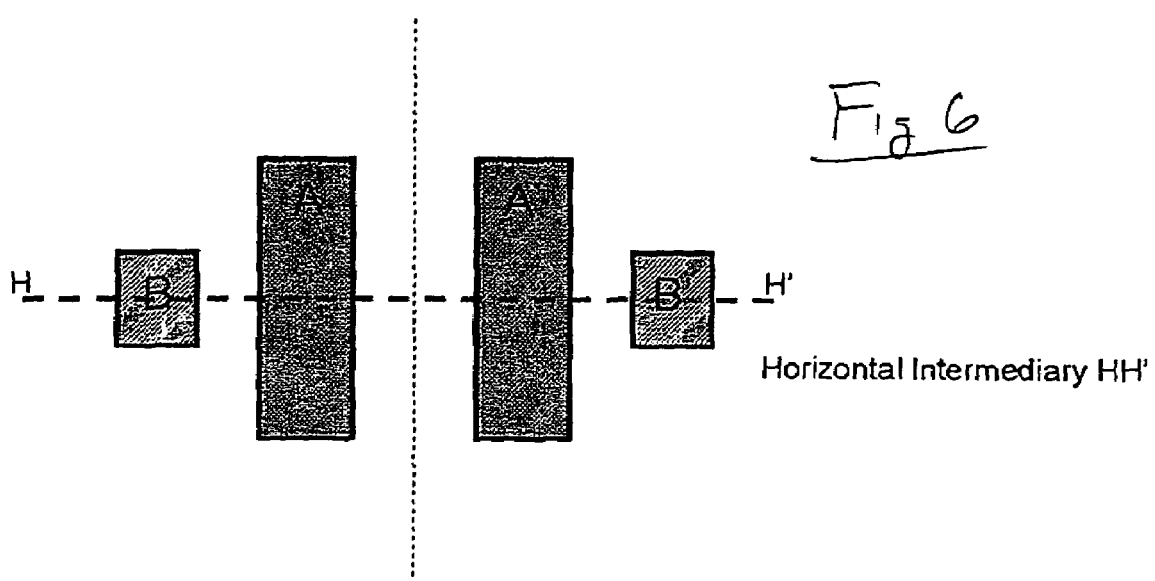
FIG. 6 is a block diagram view of horizontal symmetry about a vertical axis of symmetry.

FIG. 6 illustrates an instance of horizontal alignment, where the horizontal center lines (lines of horizontal bisection) of two pairs of symmetric devices A/A' and B/B' are aligned using a horizontal intermediary H/H'. This is a common alignment in a voltage controlled oscillator (VCO) circuit, where pairs of devices symmetric about a vertical axis of symmetry need to be aligned as shown.

Exemplary, non-limiting alignment constraints that can be input into the CLPFD solver include:

1. align(A, B, left): The left edges of objects A and B are aligned with each other.
2. align(C, D, right): The right edges of objects C and D are aligned with each other.
3. align(E, F, centerX). The vertical center lines (lines of vertical bisection) of objects E and F are aligned with each other.
4. align(G, H, top): The top edges of objects G and H are aligned with each other.
5. align(I, J, bottom): The bottom edges of objects I and J are aligned with each other.
6. align(K, L, centerY): The horizontal center lines (lines of horizontal bisection) of objects K and L are aligned with each other.
7. align(M, vIntermediary1, left): The left edge of object M is aligned with a vertical intermediary called vIntermediary1.
8. align(N, vIntermediary2, right): The right edge of object N is aligned with a vertical intermediary called vIntermediary2.
9. align(O, vIntermediary3, centerX): The vertical center line (line of vertical bisection) of object O is aligned with a vertical intermediary called vIntermediary3.
10. align(P, hIntermediary1, top). The top edge of object P is aligned with a horizontal intermediary called hIntermediary1.
11. align(Q, hIntermediary2, bottom): The bottom edge of object Q is aligned with a horizontal intermediary called hIntermediary2.
12. align(R, hIntermediary3, centerY): The horizontal center line (line of horizontal bisection) of object R is aligned with a horizontal intermediary called hIntermediary3.

Match Orientation Constraint:

Because of process variations, mismatches may occur in the electrical characteristics of identical devices. In order to minimize mismatch due to orientation dimensional variations, a group of components can be specified to match orientation. This causes the CLPFD solver to ensure that the orientation of all components in the group will be identical. The actual specification of allowed orientations for a given component is part of the description of that component itself as described above in the section entitled "Specification of Components". Desirably, the orientation that best fits the layout can be selected manually or automatically.

In general, the CLPFD solver can output a suitable error when infeasible constraints are specified. For example, if it is specified that two components match orientation and these same two components are specified to also be mirror-symmetric, conflicting constraints have been specified since mirror-symmetric components must have opposite (mirrored) orientations.

An exemplary, non-limiting match orientation constraint that can be input into the CLPFD solver includes: match_orientation([A, B, C, D]). This match orientation constraint ensures that identical components A, B, C and D will always have the same orientation, thereby reducing device mismatch.

Fixed Location Constraint:

A fixed location constraint specifies that an object be placed at an exact absolute location, i.e., the X and Y coordinates of the object are set.

An exemplary, non-limiting fixed location constraint that can be input into the CLPFD solver includes: location(A, X, Y). This fixed location constraint causes the CLPFD solver to fix object A at the position specified by the X and Y coordinates.

Pair-Wise Separation Constraint:

A pair-wise separation constraint is a useful constraint in RF designs that is typically utilized for modeling coupling awareness among critical and sensitive components and interconnects. It indicates that two objects should be placed at least specified distances apart in a given direction.

Exemplary, non-limiting pair-wise separation constraints that can be input into the CLPFD solver include:

1. location_delta(A, B, x, xDist). This pair-wise separation constraint specifies that objects A and B should be placed at least xDist units apart along the horizontal (x) direction.

2. location_delta(C, D, y, yDist). This pair-wise separation constraint specifies that objects C and D should be placed at least yDist units apart along the vertical (y) direction.

Approximate Location Constraints:

Each approximate location constraint enables objects to be constrained to general topological regions of the circuit layout, known as soft boxes. A soft box is an algorithmically computed box determined both by the size of the objects and the layout dimensions, and is defined as existing in a general region of the layout, such as upper left, upper middle, upper right, middle left, middle middle, middle right, lower left, lower middle, lower right, left, very left, right, very right, top, very top, bottom, very bottom, etc. When a soft box is designated to hold an object, the CLPFD solver constrains that object to lie only in the region of the layout defined by the specified soft box boundaries.

Exemplary, non-limiting approximate location constraints that can be input into the CLPFD solver include:
1. location(A, lowerLeft): Object A is constrained to be placed in the general lower left region of the overall layout.
2. location(B, upperRight): Object B is constrained to be placed in the general upper right region of the overall layout.

Group Constraint:

A group constraint can specify that a collection of objects should be grouped together in close proximity to one another. Each group is an abstract object comprised of actual objects that are placed on the IC such as devices, pads, junctions, nets or subnets that should be placed close to one another, without the intrusion of external objects not part of that group. Group constraints enable the notion of hierarchy to be introduced into the placement process. In connection with a group constraint, the concept of "containment" is utilized to set a hierarchical relationship wherein a basic member object is fully contained inside the physical boundaries of a so-called container group object. Containment constraints for basic member objects of a group can be automatically generated by a so-called placer during constraint transformation and local placement. Groups, such as containers, can have their own local intermediaries, (such as axes of symmetry and lines of alignment) and local placement constraints involving member basic objects and local intermediaries (such as, local symmetry, alignment, orientation, location constraints expressed within the coordinate system of the container), etc. Desirably, object position variables are resolved in the following order during hierarchical placement.
1. At the level of the group container, for the placement of basic objects inside a group. The placed group information is then propagated upwards to the next level in the hierarchy.
2. At the level of the whole layout, for the placement of self-contained basic objects and groups.

The region of layout considered exclusive to a group is determined by how the outline of the group is calculated. If the outline of the group is rectangular, then a single abstract rectangle is used to enclose all the objects in the group. If the outline of the group is conformal, then the actual boundary of the group is used to determine the group limits; and it can be modeled using a so-called k-boxes method, i.e., a collection of k rectangular boxes.

An exemplary, non-limiting group constraint that can be input into the CLPFD solver includes: group(DC_group, [bias_device_A, bias_device_B, bias_device_C]. This group constraint defines a group called DC_group comprising the three indicated bias devices. Such constraint causes the CLPFD solver to place these devices in close proximity to each other, without intrusion from any external object.

Specification of Design Rules:

An electrical circuit is realized on silicon as an IC according to a set of geometric design rules. The design rules reflect the physical constraints imposed by the manufacturing technology utilized to implement the IC and are typically in the form of minimum allowable values for certain widths, separations and overlaps. In order to overcome the scaling problem associated with semiconductor process shifting, design rules are usually expressed as a function of a single scalable parameter called $\lambda$ (lambda) that depends on the manufacturing technology being utilized. The parameter $\lambda$ is approximately the maximum permissible amount of accidental displacement. In general, technology design rules are of three types:
1. Size (or width) rules that specify the minimum width of a feature.
2. Separation rules that specify the minimum spacing distance that must be enforced between two features.
3. Overlap rules that specify the minimum overlap regions that must be enforced among elements of different mask layers.

These types of rules are defined for each layout object and are stored in a process technology file or database accessible to the CLPFD solver. A layout conforming to the given set of design rules is considered to be legal. Most layout editing environments are enhanced with tools that perform a so-called design rule correctness (DRC) check.

Exemplary, non-limiting design rule specifications that can be accessed by the CLPFD solver include:
1. (min Width "Metal1" 0.3): This is single layer physical spacing rule that defines the minimum width of an object on the mask layer Metal1 to be 0.3 units.
2. (minSpacing "Metal2" 0.3): This is single layer physical spacing rule that defines the minimum spacing or separation between objects on the mask layer Metal2 to be 0.3 units.
3. (minOverlap "Poly" "Oxide" 0.2): This is a two layer physical spacing rule that defines the minimum overlap between objects on the mask layers Poly and Oxide to be 0.2 units.

Specification of Objective Function and Search Parameters:

The CLPFD solver operates on various objects in the layout, such as devices, pads, anchors (or junctions), nets or subnets, to determine a final placement of the objects. In order to effect final placement of the objects, the following steps are executed:

Create inputs to the CLPFD solver that describe the various objects.

Declare the domains of these inputs.

Transform placement constraints (relating layout objects) into inputs into the CLPFD solver.

Transform the physical design rules for the manufacturing process into inputs into the CLPFD solver.

Based on the foregoing inputs, the CLPFD solver searches for a feasible solution using backtrack search, or for an optimal solution using branch-and-bound search.

The CLPFD solver can operate in the following three distinct modes of operation:

Straight Placement Mode: This placement mode yields a feasible solution that satisfies all constraints. In other words, straight placement mode produces a legal placement and routing, but not necessarily an optimal placement. Straight Placement Mode requires input of constraints related to the dimensions of all objects in the layout and the connectivity of the net or subnet of the layout. All other constraints and objective(s) are optional.

Optimal Placement Mode: This placement mode expects an objective cost function (described hereinafter) as input. It yields a placement and routing that is legal in that it satisfies all placement and design rule constraints, and, additionally, is optimal in terms of the cost determined by the objective function. Optimal Placement Mode requires input of constraints related to all the dimensions of the objects in the layout and the connectivity of the net or subnets. In addition, Optimal Placement Mode requires at least one objective, e.g., minimal area.

Satisfying Placement Mode: This placement mode attempts to compute the best possible placement and routing within a specified time limit ($T_{threshold}$), cost limit ($C_{threshold}$), maximum number of allowed iterations ($Iter_{threshold}$), or any other type of processing constraint that is not per se related to the placement of the objects, while satisfying all constraints. Satisfying placement mode accomplishes this by executing the following steps:

a. Initially compute a relaxed object placement solution. If cost limit $C_{threshold}$ has been specified, it can be used as the initial cost limit to seed the process.

b. If a placement can be found with a cost less than or equal to the current cost limit, then the current cost limit is reduced, and an attempt is made to obtain an improved placement having further reduced cost limit.

c. Alternatively, if a placement could not be found with a cost that is less than or equal to the current cost limit, then the current cost limit is increased and an attempt is made to obtain a placement with the increased cost limit.

d. The cost limit is, thus, iteratively adjusted, either increased or decreased, a number of times, subject to $Iter_{threshold}$, until an acceptable placement is achieved.

Satisfying Placement Mode requires input of constraints related to all the dimensions of the objects in the layout and the connectivity of the net or subnets. In addition, Satisfying Placement Mode requires at least one objective, e.g., minimal area.

This process of iterative improvement of the current placement is subject to any one or combination of the foregoing processing constraints that are not per se related to the placement of the objects. During the iterative improvement process, the best placement and routing solution discovered thus far is saved.

Desirably, the CLPFD solver first attempts to discover an optimal placement by operating in optimal placement mode. If an optimal placement cannot be found, it switches to the satisfying placement mode to compute an acceptable placement within the specified placement parameters. If satisfying placement mode fails as well, it switches to the straight placement mode and yields any feasible placement, if one exists.

Objective Function:

The CLPFD solver utilizes an objective function that can be customized to minimize any one or combination of the following:

Layout width.
Layout height.
Layout area.
Total wirelength.
Linear combination of layout area and total wirelength.

Exemplary, non-limiting objective functions that can be input into the CLPFD solver include:

1. cost_strategy(cell, width, min): This objective function specifies minimizing the layout width. In general, the cost objective function has the general form cost_strategy(<object>, <feature>, <min|max>).

2. cost_strategy(cell, height, min): This objective function specifies minimizing the layout height.

3. cost_strategy(cell, area, min): This objective function specifies minimizing the layout area, i.e., (layout width*layout height).

4. cost_strategy(cell, wirelength, min): This objective function specifies minimizing the total length of all nets in the layout.

5. cost_weights(cell, area_weight, wirelength_weight)
cost_strategy(cell, combined, min)

The first predicate, cost_weights, specifies the differentiated weights of the two components in the objective cost function, where area_weight is the weight given to the layout area, and wirelength_weight is the weight given to the total length of all interconnects in the layout. The second predicate, cost_strategy specifies the actual objective function that specifies minimizing a linear combination of layout area and total wirelength, i.e., the cost expression is [(area_weight*layout area)+ (wirelength_weight*total length of all interconnects in the layout)].

6. search_setup(max_num_iterations, timeout_single_iteration, decrease_increment, increase_increment): This predicate, which defines the search setup parameters, is utilized in both the optimal and satisfying modes of operation. Satisfying placement mode uses all four parameters or terms, whereas optimal placement mode makes use of only the timeout_single_iteration parameter or term. In the satisfying placement mode, the parameter timeout_single_iteration denotes the timeout, in for example, milliseconds, for a single CLPFD solver optimization call during the iterative solution improvement process. However, in the optimal placement mode, the parameter timeout_single_iteration is scaled by a factor (e.g., without limitation, 5) to compute the timeout, in, for example, milliseconds, that should be allowed for the CLPFD solver optimization call. Parameter max_num_iterations denotes the maximum number of iterations allowed during the iterative solution improvement process in the satisfying placement mode. Likewise, the parameters decrease_increment and increase_increment denote the percentage amounts by which the current cost limit should be decreased and increased, respectively, during the iterative solution improvement process in the satisfying placement mode.

EXAMPLE

Figure 7:
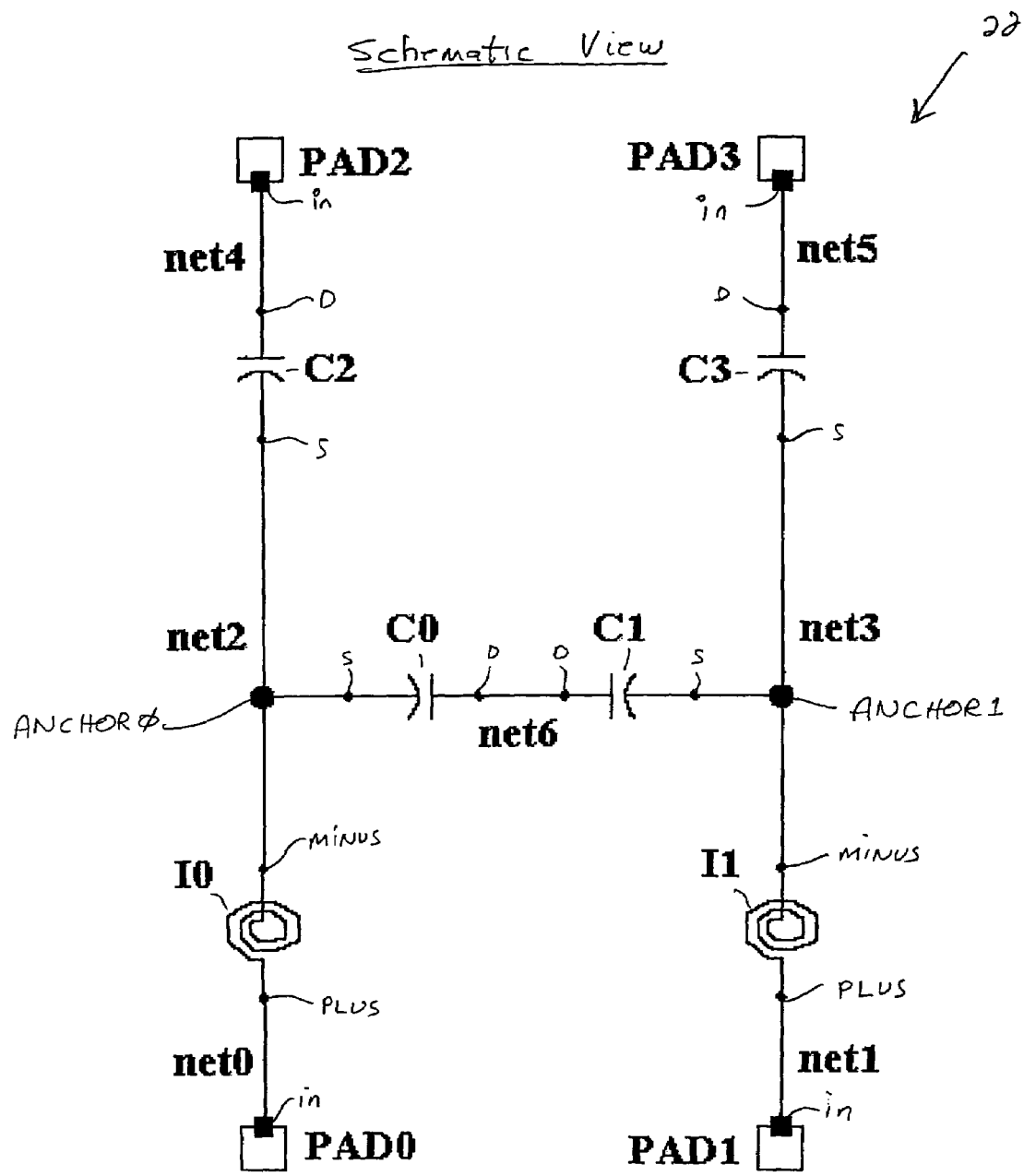
FIG. 7 is a schematic view of an exemplary circuit including the objects, i.e., devices, anchors, pads, nets and subnets, thereof.

Having thus described general, exemplary, non-limiting forms of the various constraints and objective functions that can be input into the CLPFD solver, a specific example of a subset of such inputs to the CLPFD solver will now be described with reference to the schematic view of a circuit 22 in FIG. 7 and the layout view of circuit 22 in FIG. 8.

Circuit 22 includes the following devices or components: capacitor C0; capacitor C1; capacitor C2; capacitor C3; inductor I0; and inductor I1, all connected as shown. Circuit 22 also includes pads PAD0, PAD1, PAD2 and PAD3.

Circuit 22 further includes a plurality of networks or nets connecting the devices and pads thereof. Specifically, circuit 22 includes: net0 connecting PAD0 and inductor I0; net1 connecting PAD1 and inductor I1; net2 connecting capacitor C0, capacitor C2 and inductor I0; net3 connecting capacitor C1, capacitor C3 and inductor I1; net4 connecting PAD2 and capacitor C2; net5 connecting PAD3 and capacitor C3; and net6 connecting capacitor C0 and capacitor C1. To facilitate entry of data regarding net2 and net3 into the CLPFD solver, ANCHOR0 and ANCHOR1, respectively, are defined at the junctions where the various segments or subnets of net2 and net3 come together to form said nets.

Non-limiting examples of the format of constraints and objective functions that can be input into the CLPFD solver for each object of the layout view of circuit layout 22 in FIG. 8 will now be described.

Figure 8:
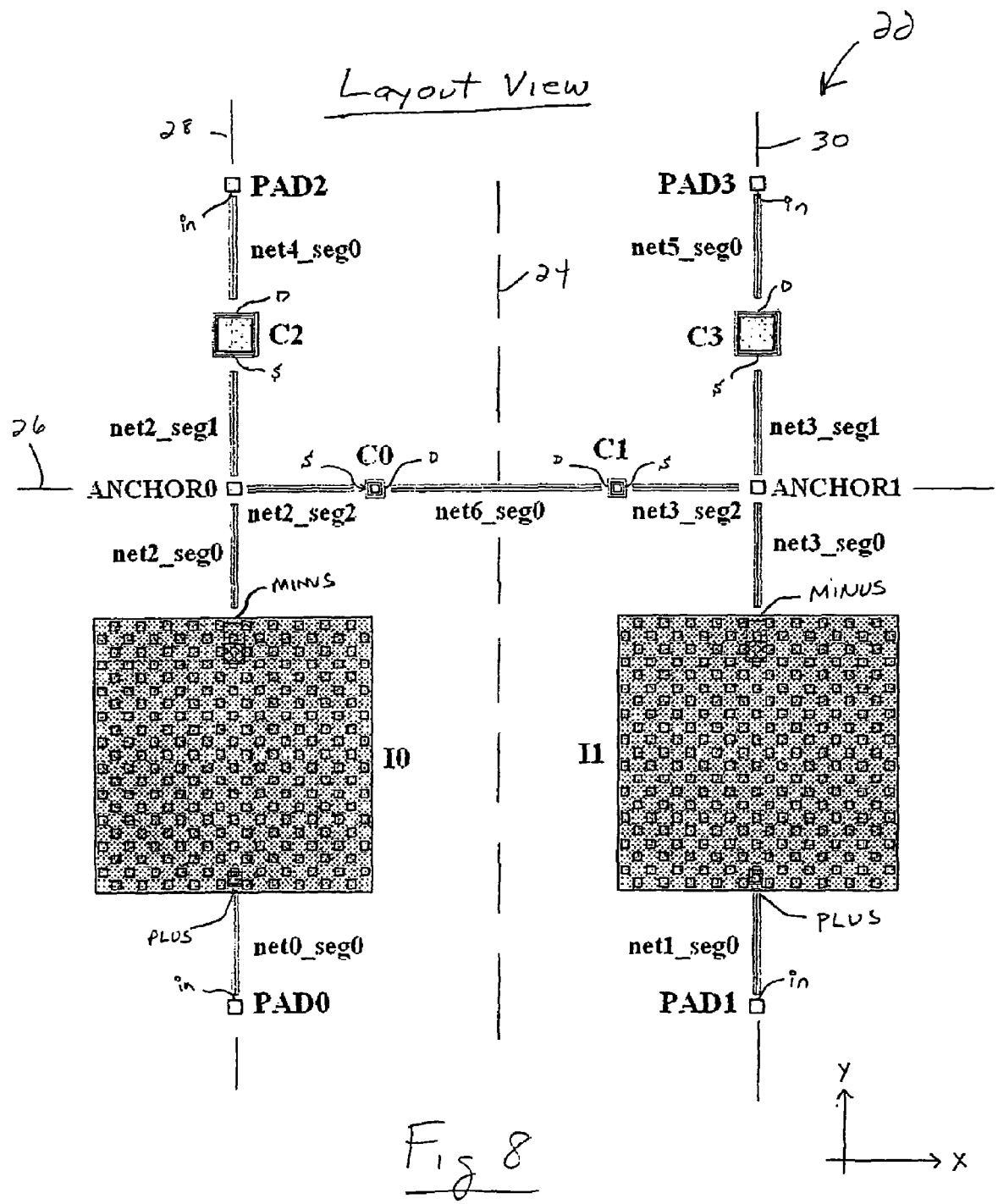
FIG. 8 is a layout view of the objects of the circuit of FIG. 7.

In the layout view of circuit layout 22 shown in FIG. 8, objects of the circuit layout include devices C0 through C3, I0 and I1, ANCHOR0, ANCHOR1, PAD0 through PAD3, net0_seg0, net1_seg0, net2_seg0 through net2_seg2, net3_seg0 through net3_seg2, net4_seg0, net5_seg0, and net6_seg0, all as shown.

An exemplary, non-limiting constraint that can be input into the CLPFD solver for each device has the following general form:

Device(<Device ID>, <Width>, <Height>, <List of device halos>, <List of device terminals>).

According to this exemplary constraint format, devices C0 through C3, I0 and I1 can have the following exemplary, non-limiting constraint formats, respectively:

1. Device(C0, 16960, 16960, [5000, 5000, 5000, 5000], [[S, net2], [D, net6]]).
2. Device(C1, 16960, 16960, [5000, 5000, 5000, 5000], [[S, net3], [D, net6]]).
3. Device(C2, 36800, 36800, [5000, 5000, 5000, 5000], [[S, net2], [D, net4]]).
4. Device(C3, 36800, 36800, [5000, 5000, 5000, 5000], [[S, net3], [D, net5]]).
5. Device(I0, 212080, 212080, [5000, 5000, 5000, 5000], [[PLUS, net0], [MINUS, net2]]).
6. Device(I1, 212080, 212080, [5000, 5000, 5000, 5000], [[PLUS, net1], [MINUS, net3]]).

With reference to the constraint format for capacitor C0 above, the first parameter "C0" denotes the device the constraint represents. The second and third parameters "16960" and "16960" denote the width and height of capacitor C0, respectively. In the illustrated embodiment, the numbers associated with the second and third parameters have units of nanometers. However, this is not to be construed as limiting the invention.

The fourth parameter, including four members, represents the halo or keep-out area surrounding capacitor C0. For example, the first member of this parameter, i.e., "5000", specifies that the top edge of capacitor C0 is to be no closer than 5000 units to another device, pad or anchor. However, each device halo is not applicable to a connecting net or subnet, which is permitted to cross a device halo to make contact with the device itself.

In a similar manner, the second, third and fourth members of the fourth parameter establish the location of the device halo at the bottom, right and left sides of capacitor C0. In the illustrated embodiment, the members of the fourth parameter of the device constraint for capacitor C0 are expressed in units of nanometers. However, this is not to be construed as limiting the invention.

The fifth parameter, [[S, net2], [D, net6]], defines the terminals of capacitor C0 and the connection of each said terminal to one of the nets of circuit 22. For example, the fifth parameter specifies that terminal S of capacitor C0 is connected to net2 and that terminal D of capacitor C0 is connected to net6.

The constraint formats for devices C1, C2, C3, I0 and I1 are the same as the constraint format for device C0 described above. Accordingly, detailed descriptions of the constraint formats for devices C1, C2, C3, I0 and I1 will not be described herein to avoid unnecessary redundancy.

In the layout view of circuit 22 shown in FIG. 8, anchor or branching point ANCHOR0 divides net2 into three subnets or segments; namely, net2_seg0, net2_seg1 and net2_seg2, the use of which will be described in greater detail hereinafter. In a similar manner, anchor or branching point ANCHOR1 separates net3 into three subnets or segments, namely, net3_seg0, net3_seg1 and net3_seg2, the use of which will be described in greater detail hereinafter.

An exemplary, non-limiting constraint that can be input into the CLPFD solver for each anchor has the following general form:

Branching_point(<Anchor ID>, <Net ID>, <Width>, <Height>, <List of branching point halos>).

According to the exemplary anchor format. ANCHOR0 and ANCHOR1 can have the following exemplary, non-limiting constraint formats:

Branching_point(ANCHOR0, net2, 10000, 10000, [5000, 5000, 5000, 5000]).

Branching_point(ANCHOR1, net3, 10000, 10000, [5000, 5000, 5000, 5000]).

The first parameter of each anchor or branching point constraint is the variable name for the anchor represented by the constraint. The second parameter, (net2 or net3) denotes the net that the anchor is associated with. The third and fourth parameters, (10000) represent the unit size of each anchor in width and height, respectively. Desirably, the unit size is expressed in terms of nanometers. However, this is not to be construed as limiting the invention. Lastly, the fifth parameter, ([5000, 5000, 5000, 5000]) denotes the position of a halo at the top, bottom, right and left sides of the corresponding anchor where other objects, except for nets or subnets, are not permitted to reside.

An exemplary, non-limiting constraint that can be input into the CLPFD solver for each PAD has the following general form:

Pad(<Pad ID>, <Width>, <Height>, <List of pad halos>, <List of pad terminals>).

According to this exemplary pad format, each pad of circuit layout 22 can have the following exemplary, non-limiting constraint format:

Pad(PAD0, 10, 10, [5000, 5000, 5000, 5000], [[in, net0]]).
Pad(PAD1, 10, 10, [5000, 5000, 5000, 5000], [[in, net1]]).
Pad (PAD2, 10, 10, [5000, 5000, 5000, 5000], [[in, net4]]).
Pad(PAD3, 10, 10, [5000, 5000, 5000, 5000], [[in, net5]]).

The first parameter of each pad constraint, e.g., PAD0, denotes the pad the constraint represents. The second and third terms of each pad constraint define the width and height, respectively, of the corresponding pad. The fourth parameter of each pad constraint, e.g., [5000, 5000, 5000, 5000] denotes the halo or key-out area of the top, bottom, right and left sides, respectively, of the corresponding pad. Lastly, the fifth parameter of each PAD constraint, e.g., [[in, net0]], denotes the net to which the corresponding pad is connected.

Net/Subnet Constraints:

Exemplary, non-limiting constraints that can be input into the CLPFD solver for each net or subnet includes:

net(<Net ID>, <List of components connected by this net>, <List of constituent segments>);

segment(<Segment ID>, <Width of the segment>, <Left object ID>, <Right object ID>, horizontal); and segment(<Segment ID>, <Width of the segment>, <Top object ID>, <Bottom object ID>, vertical).

Each net constraint includes three parameters; namely, the net name, the list of components connected by the net, and the segments associated with the net name, respectively.

Each segment constraint includes five parameters; namely, segment name or ID, width of the segment, left (or top) object name or ID, right (or bottom) object name or ID, and horizontal (or vertical).

Where a segment constraint represents a horizontal segment, the fifth parameter of the segment constraint will be "horizontal". The third and fourth parameters of each horizontal segment constraint denote the objects that are connected to the left end and the right end, respectively, of the corresponding horizontal segment.

In a like manner, when a segment constraint is related to a vertical segment, the fifth parameter of the segment constraint will be "vertical". The third and fourth parameters of each vertical segment constraint denote the objects that are connected to the top end and the bottom end, respectively, of the corresponding vertical segment.

Referring now to the layout view of circuit 22 shown in FIG. 8, the constraints associated with each net or subnet (or segment) thereof will now be described.

Network Net0:

Exemplary, non-limiting constraints that can be input into the CLPFD solver for net0 include:

net(net0, [10, PAD0], [net0_seg0]).
segment(net0_seg0, 10000, 10, PAD0, vertical).

The above net constraint for net0 includes three parameters; namely, "net0" which is the name of the net the constraint is associated with, [10, PAD0] denoting that net0 connects inductor 10 and PAD0, and [net0_seg0] which denotes the segment of net0 that connects inductor 10 and PAD0. The above segment constraint for net0 includes five parameters, namely, "net0_seg0" which is the name of the segment, 10000 which denotes the width of the segment (desirably in nanometers), 10 which denotes the object connected to the top end of the segment, PAD0 which denotes the object connected to the bottom end of the segment, and "vertical" which denotes that the corresponding segment has a vertical orientation.

Network net1:

Exemplary, non-limiting constraints that can be input into the CLPFD solver for net1 include:

net(net1, [I1, PAD1], [net1_seg0]).
segment(net1_seg0, 10000, I1, PAD1, vertical).

As can be seen, the constraints associated with net1 are similar in form to the constraints associated with net0. Accordingly, the parameters associated with the constraints of net1 will not be described herein to avoid unnecessary redundancy.

Network net2:

Exemplary, non-limiting constraints that can be input into the CLPFD solver for net2 include:

net(net2, [C0, C2, I0, ANCHOR0], [net2_seg0, net2_seg1, net2_seg2]).
segment(net2_seg0, 10000, ANCHOR0, I0, vertical).
segment(net2_seg1, 10000, C2, ANCHOR0, vertical).
segment(net2_seg2, 10000, ANCHOR0, C0, horizontal).

The above net constraint for net2 includes three parameters; namely, "net2" which is the name of the net the constraint is associated with, [C0, C2, 10, ANCHOR0] which denotes that devices C0, C2 and I0, and ANCHOR0 are connected by this net, and [net2_seg0, net2_seg1, and net2_seg2] which denotes the segments of the net associated with the constraint.

The foregoing constraints for net2 include three segment constraints, one for each segment of net2. Each segment constraint includes five parameters; namely, the segment name, e.g., "net2_seg0", the width of the segment, e.g., 10000 units (desirably expressed in nanometers), the name of the object connected to the left (or top) end of the segment, the name of the object connected to the right (or bottom) of the segment, and an orientation of the segment, e.g., horizontal (or vertical).

As can be seen, each segment constraint of net2 specifies both orientation and connection of the associated subnet in the layout view of circuit layout 22 shown in FIG. 8.

Network net3:

Exemplary, non-limiting constraints that can be input into the CLPFD solver for net3 include:

net(net3, [C1, C3, I1, ANCHOR1], [net3_seg0, net3_seg1, net3_seg2]).
segment(net3_seg0, 10000, ANCHOR1, I1, vertical).
segment(net3_seg1, 10000, C3, ANCHOR1, vertical).
segment(net3_seg2, 10000, C1, ANCHOR1, horizontal).

Since the net constraint and the segment constraints for net3 are similar to like constraints for net2 described above, the net constraint and segment constraints for net3 will not be described herein to avoid unnecessary redundancy.

Network(s) net4, net5 and net6:

Exemplary, non-limiting constraints that can be input into the CLPFD solver for net4, net5 and net6 include:

net(net4, [C2, PAD2], [net4_seg0]); and
segment(net4_seg0, 10000, PAD2, C2, vertical).
net(net5, [C3, PAD3], [net5_seg0]); and
segment(net5_seg0, 10000, PAD3, C3, vertical).
net(net6, [C0, C1], [net6_seg0]); and
segment(net6_seg0, 10000, C0, C1, horizontal).

Comparing the constraints for net4, net5 and net6 to the constraints for net0 discussed above, it can be seen that the constraints for net4, net5 and net6 are similar to like constraints for net0 described above. Accordingly, the parameters associated with the constraints of net4, net5 and net6 will not be described herein to avoid unnecessary redundancy.

Placement Constraints-Intermediary Constraints:

To aid in the specification of symmetry and alignment constraints discussed hereinafter, it has been found useful to define the following intermediary constraints for intermediaries 24, 26, 28 and 30, respectively, in the layout view of circuit 22 in FIG. 8:

intermediary(verticalSymmetryAxis, block0, 50, 0, left, _, relative).
intermediary(horizontalAlignmentLine, block0, _, _, _, floating, relative).
intermediary(verticalLeftAlignmentLine, block0, _, _, floating, _, relative).
intermediary(verticalRightAlignmentLine, block0, _, _, floating, _, relative).

Each intermediary constraint includes seven parameters; namely, the name of the intermediary; the block or level the intermediary is associated with; an X percentage; a Y percentage; the vertical reference position of the block that the X percentage is measured from; the horizontal reference position from which the Y percentage position is measured from; and whether or not the intermediary position of the block is "relative" or "absolute".

Referring now to the intermediary constraint named "verticalSymmetryAxis", the second parameter "block0" denotes that the symmetry axis entitled verticalSymmetryAxis relates to the level of placement abstraction or hierarchy denoted block0. The third parameter "50" and the fifth parameter "left" together indicate that intermediary (or symmetry line) 24 is located 50% of the distance between the leftmost edge and the rightmost edge of the objects defining block0, with reference to the leftmost edge. Hence, in the example shown in FIG. 8, intermediary 24 is positioned 50% of the way between the leftmost edge of I0 and the rightmost edge of I1, with reference to the leftmost edge of I0.

The fourth parameter of the "verticalSymmetryAxis" intermediary constraint denotes that intermediary 24 is positioned 0% away from the bottommost edge of any object comprising block0, in this case the bottommost edges of PAD0 and PAD1. For the purposes of the CLPFD solver processing "verticalSymmetryAxis" intermediary constraint, the fourth and sixth parameters could be left blank.

In the intermediary constraint shown above, the third and fifth parameters thereof are related and the fourth and sixth parameters thereof are related. However, this is not to be construed as limiting the invention.

The seventh parameter "relative" of the "verticalSymmetryAxis" intermediary constraint denotes that the position of intermediary 24 within block0 is relative. Thus, as the size of block0 is decreased (or increased) during processing of the constraints by the CLPFD solver to determine the final layout of the objects of block0 (circuit 22 in this example), the position of intermediary 24 will be adjusted by the CLPFD solver as necessary in order to maintain intermediary 24 50% of the distance between the leftmost edge and rightmost edge of objects defining block0, with reference to the left side thereof. If desired, the seventh parameter "relative" can be replaced with "absolute" which causes the CLPFD solver to maintain the initial starting position of intermediary 24 notwithstanding compaction or decompaction of the objects of block0.

With reference to the intermediary constraint named "horizontalAlignmentLine", the first and second parameters thereof denote the name associated with intermediary 26 and the block intermediary 26 is associated with. The sixth parameter "floating" denotes that intermediary 26 associated with "horizontalAlignmentLine" intermediary constraint can float or move in the Y direction. Recall that the third and fifth parameters of each intermediary constraint relate to the position of the corresponding intermediary in the X direction while the fourth and sixth parameters of each intermediary constraint relate to the position of the intermediary in the Y direction.

In general, the fifth parameter of each intermediary constraint can be "left", "right", or "floating". The sixth parameter of each intermediary constraint can be "top", "bottom", or "floating". If the fifth parameter of each intermediary constraint includes "left" or "right", then the third parameter of said intermediary constraint must include a value, e.g., a percent value that said intermediary is positioned from the corresponding leftmost or rightmost side of the block. Similarly, if the sixth parameter of an intermediary constraint is "top" or "bottom", then the fourth parameter of said intermediary constraint must include a value, e.g., a percent value, that said intermediary is positioned from the corresponding topmost or bottommost edge of the block.

The "horizontalAlignmentLine" intermediary constraint described above defines intermediary 26 as a floating intermediary that can be moved as necessary by the CLPFD solver during processing of the constraints defined herein to determine the final layout of the objects of circuit 22. The seventh parameter "relative" of the "horizontalAlignmentLine" intermediary constraint has the same meaning as the seventh parameter "relative" described above for the "verticalSymmetryAxis" intermediary constraint.

The intermediary constraints "verticalLeftAlignmentLine" and "verticalRightAlignmentLine" relate to intermediaries 28 and 30 in the layout view of circuit 22 shown in FIG. 8. Inasmuch as the format of these intermediary constraints are the same as the format of the intermediary constraints described above, detailed descriptions of these formats, especially the parameters thereof, will not be described herein to avoid unnecessary redundancy.

Symmetry Constraints:

Exemplary, non-limiting symmetry constraints for devices, anchors and pads that can be input into the CLPFD solver for circuit 22 include:

symmetry(PAD0, PAD1, verticalSymmetryAxis).
symmetry(I0, I1, verticalSymmetryAxis).
symmetry(C0, C1, verticalSymmetryAxis).
symmetry(ANCHOR0, ANCHOR1, verticalSymmetryAxis).
symmetry(C2, C3, verticalSymmetryAxis).
symmetry(PAD2, PAD3, verticalSymmetryAxis).

The symmetry constraint "symmetry (PAD0, PAD1, verticalSymmetryAxis)" denotes that PAD0 and PAD1 are symmetrical about the intermediary named "verticalSymmetryAxis", i.e., intermediary 24 in FIG. 8. Similar comments apply in respect to the other symmetry constraints disclosed above for objects I0 and I1; C0 and C1; ANCHOR0 and ANCHOR1; C2 and C3; and PAD2 and PAD3 about intermediary 24.

Exemplary, non-limiting net symmetry constraints that can be input into the CLPFD solver for circuit 22 include:

symmetry(net0_seg0, net1_seg0, verticalSymmetryAxis).
symmetry(net2_seg0, net3_seg0, verticalSymmetryAxis).
symmetry(net2_seg1, net3_seg1, verticalSymmetryAxis).
symmetry(net2_seg2, net3_seg2, verticalSymmetryAxis).
symmetry(net4_seg0, net5_seg0, verticalSymmetryAxis).

The net symmetry constraint "symmetry (net0_seg0, net1_seg0, verticalSymmetryAxis)" denotes that net0_seg0 and net1_seg0 in the layout view of circuit 22 shown in FIG. 8 are symmetric about the intermediary named "verticalSymmetry Axis", i.e., intermediary 24.

In a similar manner, the remaining net symmetry constraints disclosed above denote symmetry for net2_seg0 and net3_seg0; net2_seg1 and net3_seg1; net2_seg2 and net3_seg2; and net4_seg0 and net5_seg0 about intermediary 24.

Net Self Symmetry Constraint(s):

An exemplary, non-limiting net self symmetry constraint that can be input into the CLPFD solver for circuit 22 includes:

symmetry(net6_seg0, verticalSymmetryAxis).

The first parameter of this net self symmetry constraint includes the name, e.g., net6_seg0, of the net or subnet. The second parameter is the name of the intermediary about which the net or subnet is self symmetric. In the layout view of the circuit layout 22 shown in FIG. 8, it can be seen that net6_seg0 is self symmetric about intermediary 24, also called the "verticalSymmetryAxis".

Alignment Constraints:

Each alignment constraint defines the objects that are aligned along a line of alignment defined by a corresponding symmetry constraint. Exemplary, non-limiting alignment constraints that can be input into the CLPFD solver for circuit 22 include:

align([C2, I0, ANCHOR0, PAD0, PAD2], vcenter, verticalLeftAlignmentLine).
align([C3, I1, ANCHOR1, PAD1, PAD3], vcenter, verticalRightAlignmentLine).
align([C0, C1, ANCHOR0, ANCHOR1], hcenter, horizontalAlignmentLine).

Each alignment constraint includes three parameters; namely, a first parameter that defines the objects associated with the alignment constraint; a second parameter that denotes where the alignment of each object occurs, e.g., vertical or horizontal center, left edge, right edge, top edge, bottom edge, and the like; and a third parameter that denotes the intermediary on which the objects associated with the alignment constraint are aligned.

With reference to FIG. 8, the three alignment constraints disclosed above respectively define the vertical center alignment of objects C2, 10, ANCHOR0, PAD0 and PAD2 about intermediary 28; the vertical center alignment of objects C3, I1 ANCHOR1, PAD1 and PAD3 about intermediary 30; and the horizontal center alignment of objects C0, C1, ANCHOR0 and ANCHOR1 about intermediary 26.

Topological/Spatial Constraints:

Exemplary, non-limiting topological/spatial constraints that can be input into the CLPFD solver for circuit 22 include:

left(PAD0, PAD1); left(I0, I1); left(ANCHOR0, C0); left (C0, C1);

left(C1, ANCHOR1); left(C2, C3); left(PAD2, PAD3); top (PAD2, C2);

top(C2, ANCHOR0); top(ANCHOR0, I0); top(I0, PAD0); top(PAD3, C3);

top(C3, ANCHOR1); top(ANCHOR1, I1); and top(I1, PAD1).

The topological/spatial constraint "left (PAD0, PAD1)" denotes that PAD0 is to the left of PAD1. Similarly, the topological/spatial constraint "left (I0, I1)" denotes that object I0 is positioned to the left of object I1. Moreover, the topological/spatial constraint "top (PAD2, C2)" denotes that PAD2 is positioned to the top of object C2.

Regardless of the form thereof, each topological/spatial constraint defines for the CLPFD solver the relative location of one object to another object in the layout view of circuit 22 in FIG. 8. Thus, the particular format of the topological/spatial constraints described above are not to be construed as limiting the invention. For example, the topological/spatial constraint "left (PAD0, PAD1)" can alternatively be expressed as "right (PAD 1, PAD0)". Similarly, topological/spatial constraint "top (PAD2, C2)" can alternatively be expressed as "bottom (C2, PAD2)".

Design Rule Constraints:

In a manner similar to the foregoing constraints, the design rules for the manufacturing technology to be utilized to realize a layout of the objects of circuit 22 may also be prepared as constraints for input into the CLPFD solver. Inasmuch as it is believed that such design rule constraints can be determined by one skilled in the art, a detailed description of possible design rule constraints that can be input into the CLPFD solver will not be discussed herein.

Objective Function Formulation:

As discussed above in the section entitled "Objective Function", the CLPFD solver utilizes the objective function to determine the layout of objects of circuit 22. Exemplary, non-limiting objective functions that can be input into the CLPFD solver for circuit 22 include:

cost_weights(block0, 2, 3).
cost_strategy(block0, combined, min).
search_setup(5, 250, 30, 10).

The objective function "cost_weights(block0, 2, 3)" includes three parameters. The first parameter "block0" is the name of the block associated with the objective function. The second parameter "2" is a multiplier for an area of block0, e.g., 2*(area of block0). The third parameter "3" is a multiplier for the total length of all the nets and subnets of block0.

The objective function "cost_strategy(block0, combined, min)" includes three parameters. The first parameter is the name of the block associated with the objective function. The second parameter "combined" denotes combining the linear combination of layout area and total net length utilizing the cost_weights 2 and 3, respectively, discussed above in connection with the objective function "cost_weights(block0, 2, 3)". For example, in the present example, "combined" causes the CLPFD solver to implement the following expression [(2*area of block0)+(3*total net (and subnet) length of block0)].

The third parameter "min" in the objective function "cost_strategy(block0, combined, min)" causes the CLPFD solver to minimize the weighted linear combination of layout area and total wire length associated with "block0". Hence, the objective function "cost strategy(block0, combined, min)" causes the CLPFD solver to minimize the combination of the layout area and the total length of all the nets of circuit 22.

Alternatively, the objective function "search_setup(5, 250, 30, 10)" may be included in the set of objective functions input into the CLPFD solver. This latter objective function includes processing constraints that are imposed on the CLPFD solver that are not related per se to the placement of objects. For example, the first parameter "5" can be the number of iterations the CLPFD solver is permitted to run before outputting results. The second parameter "250" is the maximum time, e.g., in seconds, milliseconds, and the like, that the CLPFD solver is permitted to run for a single iteration of determining a layout of the objects of circuit 22. Lastly, the third and fourth parameters, namely, "30" and "10" denote percentage amounts by which a current cost limit can be decreased and increased, respectively, during the iterative solution improvement process in the so-called satisfying placement mode, versus straight placement mode or optimal placement mode.

Once all of the necessary and/or desirable constraints and, optionally, objective function(s) for circuit 22 have been input into the CLPFD solver, the CLPFD solver is executed (or called) whereupon it processes the constraints subject to the objective function(s), if provided (see discussion regarding Straight Placement Mode above) to determine the simultaneous placement of devices, pads, anchors, nets and subnets of circuit 22.

The objective function "cost_strategy(block0, combined, min)" is but one example of a cost strategy that can be utilized. For example, as discussed above, the cost strategy objective function can be set to minimize the width of block0, to minimize the height of block0, to minimize the area of block0, to minimize the net length of block0, or any combination of the foregoing as deemed suitable and/or desirable by one skilled in the art. Thus, the discussion herein of minimizing the combination of the area and the net length of block0 is not to be construed as limiting the invention.

Because the physical relationship of each object of circuit 22 has been defined with respect to one or more other objects of circuit 22, once executed, the CLPFD solver is capable of producing a final (perhaps optimal) layout of the objects of circuit 22, i.e., devices, pads, anchors, nets and subnets of circuit 22, quicker and more accurately than the prior art where the placement of devices and pads occurred independently of the routing of nets and wherein it was often necessary to perform a number of time consuming iterations of placement and routing, with fine tuning of the placement of devices and pads between each iteration, before an acceptable combination of placement and routing was found.

The invention has been described with reference to the preferred embodiments. Obvious modifications and alterations will occur to others upon reading and understanding the preceding detailed description. For example, the formats of the foregoing constraints and objective functions are exemplary and are not to be construed as limiting the invention since it is envisioned that any suitable and/or desirable format for each constraint and/or objective function can be utilized as necessary and/or desirable for input into any suitable and/or desirable solver selected by one of ordinary skill in the art. Moreover, the number and/or types of constraints described above are not to be construed as limiting the invention since it is envisioned that any suitable number and/or type of constraints can be input into the solver that enables the solver to determine a final layout of the objects in the manner described above. It is intended that the invention be construed as including all such modifications and alterations insofar as they come within the scope of the appended claims or the equivalents thereof.

The invention claimed is:

1. A computer-implemented method of placement of components and networks (nets), utilized for interconnecting said components, of a circuit layout, the method comprising:
    (a) providing in a computer storage a solver operative under the control of a processor of the computer for implementing optimizing software;
    (b) inputting into the solver provided in the computer storage for each device of the circuit layout data regarding: (1) the dimensions of said device, (2) each terminal of said device and (3) the connection of each terminal to at least one net of the circuit layout;
    (c) inputting into the solver provided in the computer storage for each pad (or land) of the circuit layout data regarding: (1) the dimensions of said pad and (2) the connection of said pad to at least one net;
    (d) inputting into the solver provided in the computer storage for each junction (or anchor) of a net of the circuit layout data regarding the dimensions of said junction;
    (e) inputting into the solver provided in the computer storage for each net or segment thereof data regarding: (1) at least one dimension of said net or segment, (2) an orientation of said net or segment in the circuit layout, (3) the connection of each terminal of said net or segment to a device, pad, or junction, and (4) the relative locations of the terminals of said net or segment with respect to each other;
    (f) inputting into the solver provided in the computer storage at least one intermediary that defines an imaginary line in the circuit layout that is used as a reference for determining the position of at least one object of the circuit layout, wherein each object is either a device, a pad, a junction, or a net or segment thereof;
    (g) inputting into the solver provided in the computer storage at least one symmetry constraint that defines positional symmetry between at least two objects of the circuit layout about an intermediary input in step (f);
    (h) inputting into the solver provided in the computer storage at least one alignment constraint that defines an alignment between at least two objects of the circuit;
    (i) inputting into the solver provided in the computer storage a plurality of topological constraints, each of which defines the relative position of at least two objects of the circuit layout;
    (j) inputting into the solver provided in the computer storage at least one objective for the solver to attempt to satisfy based on the constraints input to the solver, wherein the objective includes minimizing at least one of the area of the circuit layout and a total length of the nets of the circuit layout; and
    (k) causing the processor of the computer to execute the solver to process the input constraints subject to the input objective(s) to simultaneously determine placements of the objects and the nets that is either (1) satisfactory, given a processing constraint imposed on the solver that is not related per se to said placements, (2) legal and feasible, or (3) optimal.

2. The method of claim 1, wherein the solver is a constraint logic programming over finite domains (CLPFD) solver.

3. The method of claim 2, wherein the CLPFD solver is the SICStus Prolog solver.

4. The method of claim 1, wherein each symmetry constraint is either:
    a simple symmetry constraint wherein two identical objects having the same orientation are placed on either side of the intermediary;
    a mirror symmetry constraint wherein two identical objects having mirror-image orientation are placed on either side of the intermediary; or
    a self symmetry constraint wherein one object is placed symmetrically on the intermediary.

5. The method of claim 1, wherein each alignment constraint specifies alignment of the at least two objects thereof along edges, sides or centers thereof.

6. The method of claim 5, wherein the edges, sides or centers of the two objects are further aligned to an intermediary input in step (f).

7. The method of claim 1, further including inputting into the solver provided in the computer storage at least one of the following constraints prior to executing step (k):
    an orientation constraint that defines a common orientation for at least two identical objects;
    a fixed location constraint that defines an exact location of an object in the circuit layout; and
    a pair-wise separation constraint that defines a minimum distance that at least two objects should be placed from one another.

8. The method of claim 1, wherein at least one of steps (b), (c) or (d) further includes inputting into the solver provided in the computer storage for at least one object thereof halo dimensions which define a minimum distance said object can be spaced from another object.

9. The method of claim 1, wherein, in step (e):
    the orientation is either vertical or horizontal;
    each net or segment thereof includes a terminal on each end thereof; and
    the relative location of one terminal of a net or segment is either to the top, bottom, right or left of another terminal of the net or segment.

10. A computer-implemented method of placement of devices, pads and networks (nets), utilized for interconnecting said devices and pads, of a circuit layout, the method comprising:
    (a) storing in a storage of a computer for each device of the circuit layout a device constraint that comprises dimensions and terminal(s) of said device and the connection of each terminal of said device to a net of the circuit layout;
    (b) storing in the storage of the computer for each pad (or land) of the circuit layout a pad constraint that comprises dimensions of said pad and the connection of said pad to a net of the circuit layout;
    (c) storing in the storage of the computer for each junction (or anchor) of a net of the circuit layout a junction constraint that comprises dimensions of said junction and the association of said junction with said net;
    (d) storing in the storage of the computer for each net or segment thereof of the circuit layout a net constraint that comprises at least one dimension and terminals of said net or segment thereof and the connection of each terminal of said net or segment thereof to a device, pad, or junction of the circuit layout;

(e) storing in the storage of the computer an objective for minimizing at least one of the area of the circuit layout in which the devices, pads, junctions and nets reside and/or a total length of the nets of the circuit layout; and (f) a processor of the computer executing an optimization program to process each defined constraint subject to the objective defined in step (e) to simultaneously determine placements of the devices, pads and nets.

11. The method of claim 10, where the optimization program determines placements of the devices, pads and nets that is either (1) satisfactory given a processing constraint imposed on the optimization program that is not per se related to said placements, (2) legal and feasible, or (3) optimal.

12. The method of claim 10, further including, prior to step (f), the steps of:

storing in the storage of the computer for each intermediary (or imaginary line) defined in the circuit layout that is used as a reference for determining the position of at least one object of the circuit layout, an intermediary constraint that comprises an orientation of the intermediary and its location in the circuit layout, wherein each object is either a device, pad, junction, or net or segment thereof; and storing in the storage of the computer at least one of the following:

a symmetry constraint that defines positional symmetry between at least two objects of the circuit layout about an intermediary;

an alignment constraint that defines an alignment between at least two objects of the circuit; and/or a topological constraint that defines the relative position of at least two objects of the circuit layout.

13. The method of claim 10, wherein the optimization program is a constraint logic programming over finite domains (CLPFD) optimization program.

14. The method of claim 13, wherein the CLPFD optimization program is the SICStus Prolog optimization program available from Swedish Institute of Computer Science, P.O. Box 1263, SSE-164 29 Kista, Sweden.

15. A computer-implemented method of placement of devices and networks (nets), utilized for interconnecting said devices, of a circuit layout, the method comprising:

(a) storing in a storage of a computer constraints related to the positions of objects of a circuit layout with respect to one another, wherein each object is either a net or segment thereof, an electronic device, a pad, or a junction of a net of the circuit layout;

(b) storing in the storage of the computer for each net or segment thereof of the circuit layout a net constraint that comprises an orientation of said net or segment thereof in the circuit layout, the terminals of said net or segment thereof, and the connection of each terminal of said net or segment thereof to another object of the circuit layout; and (c) a processor of the computer minimizing at least one of the following subject to the constraints stored in the storage of the computer thereby simultaneously determining a layout of the objects and the nets:

an area in which the objects of the circuit layout reside;
an area in which the nets of the circuit layout reside; and/or
the total length of the nets of the circuit layout.

16. The method of claim 15, wherein the constraints of step (a) include at least one of the following:

a symmetry constraint that comprises positional symmetry between at least two objects of the circuit layout;
an alignment constraint that defines an alignment between at least two objects of the circuit; and/or
a topological constraint that defines the relative position of at least two objects of the circuit layout.

17. The method of claim 16, further including storing in the storage of the computer at least one imaginary line in the circuit layout that is utilized by at least one of the symmetry or alignment constraints for placement of the two objects thereof.

18. The method of claim 15, wherein the constraints of step (a) include at least one of the following:

a device constraint that comprises dimensions and terminal(s) of an electronic device of the circuit layout and the connection of each terminal of said electronic device to a net of the circuit layout;

a pad constraint that comprises dimensions of a pad (or land) of the circuit layout and the connection of said pad to a net of the circuit layout; and a junction constraint that comprises dimensions of a junction (or anchor) of a net of the circuit layout and the association of said junction with said net.

19. A computer-implemented method of placement of components and networks (nets), utilized for interconnecting said components, of a circuit layout, the method comprising:

(a) storing in a storage of a computer data regarding the position of each component, pad (or land) and/or junction (or anchor) of a net of a circuit layout with respect to at least one other component, pad or junction of a net of the circuit layout;

(b) storing in the storage of the computer data regarding connections of nets or segments thereof to said components, pads and/or junctions;

(c) storing in the storage of the computer data regarding the horizontal or vertical orientation of each net or segment thereof in the circuit layout; and (d) a processor of the computer determining a simultaneous placement of the components, pads and/or junctions and the nets as a function of the data stored in the storage of the computer in steps (a)-(c) subject to at least one of the following: (1) an area of the circuit layout in which the components, pads and/or junctions and the nets reside, and (2) a total length of the nets of the circuit layout.

20. A computer-implemented method of placement of components and networks (nets), utilized for interconnecting said components, of a circuit layout, the method comprising:

storing in a storage of a computer for electrical devices, pads (or lands) and networks (nets) of a circuit layout a listing of the positions thereof with respect to one another, connections therebetween and the orientation of each net or segment thereof in the circuit layout; and a processor of the computer processing the listing subject to at least one objective thereby simultaneously determining a placement of the electrical devices, the pads and the networks.

21. A method of placement of objects of a circuit layout, the method comprising:

(a) storing in a storage of a computer constraints for objects of a circuit layout, wherein each constraint comprises at least one dimension of the corresponding object, each object is either a circuit device, a pad, a net or segment thereof, or a junction of nets and/or segments thereof, and said constraints define the connectivity of the net(s) or segment(s) thereof to the other objects of the circuit layout; and (b) a processor of the computer executing an optimization program to process the constraints stored in the storage of the computer to simultaneously determine the placement of all of the objects of the circuit layout.

22. The method of claim 21, further including storing in the storage of the computer at least one objective for the placement of the objects, wherein step (b) includes the processor of the computer utilizing the optimization program to process the defined constraints subject to the objective(s) stored in the storage of the computer to simultaneously determine placements of all of the objects.

* * * * *